United States Patent [19]

Baliga

[11] Patent Number: 5,306,930
[45] Date of Patent: Apr. 26, 1994

[54] EMITTER SWITCHED THYRISTOR WITH BURIED DIELECTRIC LAYER

[75] Inventor: Bantval J. Baliga, Raleigh, N.C.

[73] Assignee: North Carolina State University at Raleigh, Raleigh, N.C.

[21] Appl. No.: 990,290

[22] Filed: Dec. 14, 1992

[51] Int. Cl.[5] .................. H01L 29/74; H01L 31/111
[52] U.S. Cl. ................................. 257/147; 257/152; 257/163; 257/136; 257/138; 257/144
[58] Field of Search ............... 257/147, 148, 150, 151, 257/152, 153, 154, 155, 156, 133, 136, 138, 169

[56] References Cited

U.S. PATENT DOCUMENTS

| | | | |
|---|---|---|---|
| 4,062,032 | 12/1977 | Neilson | 257/169 |
| 4,760,431 | 7/1988 | Nakagawa et al. | 357/23.4 |
| 4,914,496 | 4/1990 | Nakagawa et al. | 357/38 |
| 4,928,155 | 5/1990 | Nakagawa et al. | 357/23.4 |
| 4,954,869 | 9/1990 | Bauer | 357/38 |
| 4,956,690 | 9/1990 | Kato | 357/38 |
| 4,959,703 | 9/1990 | Ogura et al. | 357/38 |
| 4,963,972 | 10/1990 | Shinobe et al. | 357/38 |
| 5,014,102 | 5/1991 | Adler | 357/38 |
| 5,086,323 | 2/1992 | Nakagawa et al. | 357/23.4 |
| 5,089,864 | 2/1992 | Sakurai | 357/23.4 |
| 5,091,766 | 2/1992 | Terashima | 357/38 |
| 5,093,701 | 3/1992 | Nakagawa et al. | 357/23.4 |
| 5,099,300 | 3/1992 | Baliga | 357/37 |
| 5,105,244 | 4/1992 | Bauer | 357/23.4 |
| 5,144,401 | 9/1992 | Ogura et al. | 357/38 |

FOREIGN PATENT DOCUMENTS 0182259  8/1986  Japan .................................. 257/147

OTHER PUBLICATIONS

Shekar et al; "Experimental Demonstration of the emitter Switched Thyristor"; pp. 128–131.

Baliga; "Enhancement- and Depletion Mode Vertical channel MOS gated Thyristors"; Sep. 27, 1979; pp. 645–647.

Baliga, Adler, Gray and Love, "The Insulated Gate Rectifier (IGR): A New Power Switching Device," IEEE, IEDM-82, pp. 264–267, 1982.

Temple, "MOS Controlled Thyristors (MCT'S), IEDM-84", pp. 282–285, 1984.

Baliga, Adler, Love, Gray and Zommer, "The Insulated Gate Translator: A New Three-Terminal MOS-Controlled Bipolar Power Device, IEEE Transactions on Electron Devices", vol. ED-31, No. 6, pp. 821–828, Jun., 1984.

(List continued on next page.)

*Primary Examiner*—Rolf Hille
*Assistant Examiner*—Wael Fahmy
*Attorney, Agent, or Firm*—Bell, Seltzer, Park & Gibson

[57] ABSTRACT

An emitter switched thyristor with buried dielectric layer includes a contiguous P-N-P-N series of semiconductor regions between an anode contact and cathode contact. These regions correspond to an anode region of second conductivity type, a first base region of first conductivity type, a second base region of second conductivity type on the first base region, and a floating emitter region contacting the second base region and forming a P-N junction therewith. In addition, a field effect transistor is also provided between the cathode contact and the floating emitter for controlling turn-on and turn-off. An insulating region is also provided between the cathode region and the second base region and prevents the formation of a parasitic thyristor between the cathode contact and the anode contact. The insulating region preferably includes a buried dielectric layer selected from the group consisting of $SiO_2$, $Si_3N_4$, $Al_2O_3$ and $MgAl_2O_4$. The insulating region is preferably formed using SIMOX processing techniques.

17 Claims, 6 Drawing Sheets

OTHER PUBLICATIONS

Baliga and Chang, "The MOS Depletion-Mode Thyristor: A New MOS-Controlled Bipolar Power Device", IEEE Electron Device Letters, vol. 8, No. 8, pp. 411-413, Aug., 1988.

Baliga, "The MOS-Gated Emitter Switched Thyristor", IEEE Electron Device Letters (reprint), vol. 11, No. 2, pp. 75-77, Feb., 1990.

Nandakumar, Baliga, Shekar, Tandon and Reisman, "A New MOS-Gated Power Thyristor Structure with Turn-Off Achieved by Controlling the Base Resistance," IEEE Electron Letters, vol. 12, No. 5, pp. 227-229, May, 1991.

Shekar, Baliga, Nandakumar, Tandon and Reisman, "Characteristics of the Emitter-Switched Thyristor", IEEE Transactions on Electron Devices, vol. 38, No. 7, pp. 1619-1623, Jul., 1991.

Nandakumar, Baliga, Shekar, Tandon and Reisman, "The Base Resistance Controlled Thyristor (BRT) 'A New MOS Gated Power Thyristor'", IEEE, pp. 138-141, 1991.

Shekar, Baliga, Nandakumar, Tandon and Reisman, "Experimental Demonstration of the Emitter Switched Thyristor", pp. 128-131.

EMITTER SWITCHED THYRISTOR WITH BURIED DIELECTRIC LAYER

CROSS REFERENCE TO RELATED APPLICATIONS

This application is related to application Ser. No. 07/990,062, entitled INSULATED GATE BIPOLAR TRANSISTOR WITH REDUCED SUSCEPTIBILITY TO PARASITIC LATCH-UP; and application Ser. No. 07/990,659, entitled BASE RESISTANCE CONTROLLED THYRISTOR WITH INTEGRATED SINGLE POLARITY GATE CONTROL; both filed concurrently herewith.

FIELD OF THE INVENTION

The present invention relates to semiconductor switching devices, and more particularly to thyristors with MOS-gated control for inhibiting parasitic thyristor formation.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling large current densities in the range of 40–50 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. For example, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device occurs at high temperatures, making emitter ballasting schemes necessary.

The power MOSFET was developed to address this base drive problem. In a power MOSFET, a gate electrode bias is applied for turn-on and turn-off control. Turn-on occurs when a conductive channel is formed between the MOSFET's source and drain regions under appropriate bias. The gate electrode is separated from the device's active area by an intervening insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry and devices can be easily implemented on a single chip. As compared to bipolar technology, the simple gate control provides for a large reduction in cost and a significant improvement in reliability.

These benefits are offset, however, by the high on-resistance of the MOSFET's active region, which arises from the absence of minority carrier injection. As a result, the device's operating forward current density is limited to relatively low values, typically in the range of 10 A/cm$^2$, for a 600 V device, as compared to 40–50 A/cm$^2$ for the bipolar transistor.

On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. Thus, in the insulated gate transistor (IGT), disclosed in an article by inventor B. J. Baliga, and M. S. Adler, R. P. Love, P. V. Gray and N. Zommer, entitled "*The Insulated Gate Transistor: A New Three terminal MOS Controlled Bipolar Power Device,*" IEEE Trans. Electron Devices, ED-31, pp. 821–828 (1984), on-state losses were shown to be greatly reduced when compared to power MOSFETs. This was caused by the conductivity modulation of the IGT's drift region during the on-state. Moreover, very high conduction current densities in the range of 200–300 A/cm$^2$ can also be achieved. Accordingly, an IGT can be expected to have a conduction current density approximately 20 times that of a power MOSFET and five (5) times that of an equivalently sized bipolar transistor. Typical turn-off times for the IGT can be expected to be in the range of 10–50 $\mu$s. A cross-sectional representation of a typical insulated gate transistor is shown in FIG. 1.

Although gate-controlled transistors, such as the IGT, represent an improvement over using bipolar or MOSFET devices alone, even lower conduction losses can be expected by using a thyristor. This is because thyristors offer a higher degree of conductivity modulation and a lower forward voltage drop when turned on. Consequently, the investigation of thyristors is of great interest so long as adequate methods for providing forced gate turn-off can also be developed. As will be understood by one skilled in the art, a thyristor in its simplest form comprises a four-layer P1-N1-P2-N2 device with three P-N junctions in series: J1, J2, and J3, respectively. The four layers correspond to the anode (P1), the first base region (N1), the second base or P-base region (P2) and the cathode (N2), respectively. In the forward blocking state, the anode is biased positive with respect to the cathode and junctions J1 and J3 are forward biased and J2 is reversed-biased and most of the forward voltage drop occurs across the central junction J2. In the forward conducting state, all three junctions are forward biased and the voltage drop across the device is very low and approximately equal to the voltage drop across a single forward biased P-N junction.

An inherent limitation to the use of thyristors for high current applications is sustained latch-up, however, arising from the coupled P1-N1-P2 and N1-P2-N2 bipolar transistors which make up the four layers of the thyristor. This is because sustained thyristor latch-up can result in catastrophic device failure if the latched-up current is not otherwise sufficiently controlled by external circuitry or by reversing the anode potential. Sustained latch-up can occur, for example, when the summation of the current gains for the thyristor's regeneratively coupled P1-N1-P2 and wide base P1-N2-P2 transistors exceeds unity. An alternative to providing external circuitry or reversing the anode potential to obtain turn-off, however, is to use a MOS-gate for controlling turn-on and turn-off.

Several methods for obtaining MOS-gate control over thyristor action, including latch-up, exist. For example, in the MOS-controlled thyristor (MCT), turn-off is provided by shorting the emitter-base junction of the N-P-N transistor to thereby produce a reduction in gain. This form of control ideally raises the holding current of the thyristor to a level above the operating current level. Accordingly, an MCT structure has been reported which utilizes a P-channel MOSFET integrated into the cathode region of a thyristor for turn-off control, and an N-channel MOSFET integrated into the P-base region for turn-on control, as shown in FIG. 2. This device and its complementary counterpart are described in an article by V. A. K. Temple, entitled "*The MOS Controlled Thyristor,*" published in IEDM Technology Digest, Abstract 10.7, pp. 282–285, (1984). However, the maximum controllable current density, which is a direct measure of a device's ability to turn-off, is limited by the MOSFET inversion-layer channel resistance and other resistances in the base region. Because of the lower mobility for holes in silicon, MCT's built from n-type high-voltage drift layers exhibit poor current turn-off characteristics.

Other examples of MOS-gated thyristors include the depletion-mode thyristor (DMT), shown in FIG. 3, which overcame many of the drawbacks associated with the MCT. In the DMT, a depletion-mode MOSFET is placed in series with the base of the P-N-P transistor. Accordingly, once the thyristor is turned-on, current flow can be shut off by application of a negative gate bias. This eliminates the base drive by pinching off the base current to the P-N-P transistor and shuts off the device.

Recently, a base resistance controlled thyristor (BRT) was described in U.S. Pat. No. 5,099,300, to inventor B. J. Baliga, and an article entitled "*A New MOS-Gated Power Thyristor Structure with Turn-Off Achieved by Controlling the Base Resistance,*" by M. Nandakumar, inventor B. J. Baliga, M. Shekar, and S. Tandon and A. Reisman, IEEE Electron Device Letters, Vol. 12, No. 5, pp. 227–229, May, 1991, both of which are hereby incorporated herein by reference. The BRT operates by modulating the lateral P-base resistance of the thyristor using MOS gate control. Operational BRTs with 600-volt forward blocking capability, such as the one shown in FIG. 4, have been developed. FIG. 4 is a reproduction of FIG. 1 from the aforesaid Nandakumar, et al. article. The BRT can be turned-off by application of a negative bias to a P-channel enhancement-mode MOSFET to thereby reduce the resistance of the P-base by shunting majority charge carriers to the cathode. As will be understood by one skilled in the art, the reduction in P-base resistance results in an increase in the device's holding current to above the operational current level and shuts-off the device.

In another device, described in an article entitled "*The MOS-Gated Emitter Switched Thyristor,*" by inventor B. J. Baliga, published in IEEE Electron Device Letters, Vol. 11, No. 2, pp. 75–77, February, 1990, turn-on is achieved by forcing the thyristor current to flow through an N-channel enhancement-mode MOSFET and floating N+emitter integrated within the P-base region. This article is hereby incorporated herein by reference. A cross-sectional representation of this structure and equivalent circuit is shown in FIGS. 5A and 5B, which are reproductions of FIG. 1 from the aforesaid Baliga article. As will be understood by one skilled in the art, the length of the floating N+emitter region, which determines the value of large resistance R shown in FIG. 5B, controls the holding and triggering current for the device. Turn-off of the emitter switched device (EST) is accomplished by reducing the gate voltage on the MOSFET to below the threshold voltage. This cuts off the floating N+region from the cathode and ideally shuts-off the device.

Unfortunately, the integration of the MOSFET into the P-base region causes a parasitic thyristor to be formed, as shown in FIG. 5A, wherein the N+source region of the N-channel MOSFET also comprises the N+emitter of the vertical parasitic thyristor between the anode and cathode. If this thyristor turns-on, the EST can no longer be turned off by reducing the MOSFET gate voltage to zero. Turn-on of the parasitic thyristor is initiated by the onset of electron injection from the N+emitter region of the parasitic thyristor when forward biased, and is dictated by the resistance of the P-base under the N+emitter region. The likelihood that parasitic latch-up will occur can be reduced if the P-base resistance (small R) is lowered by making the length of the N+emitter region small and by using a P+diffusion to reduce the sheet resistance of the P-base. By keeping the resistance under the N+emitter of the parasitic thyristor as small as possible, the likelihood that the P+/N+junction will become forward biased when the thyristor is turned-on is reduced. The likelihood of injection of electrons from the N+emitter can also be reduced by shorting the P+diffusion to the cathode, as shown. Notwithstanding these techniques to prevent latch-up, however, a multicell EST switching device rated for 1 amp has been shown to be susceptible to parasitic latch-up failure at about 2.5 amps for a gate voltage of 10 volts for a 600 volt device. This low latch-up level limits the suitability of using emitter switched devices for higher current applications.

Other attempts to limit the likelihood of sustained parasitic latch-up have been made. For example, in a related copending application entitled Emitter Switched Thyristor with Base Resistance Control, Ser. No. 07/897,456, filed Jun. 10, 1992, by M. S. Shekar, M. Nandakumar and inventor B. J. Baliga, the probability of sustained parasitic thyristor action preventing turn-off was reduced by incorporating a current diverting means adjacent the parasitic thyristor to thereby reduce the effective resistance of the second base region during turn-off and further inhibit latch-up by preventing the forward biasing of the P+/N+junction beneath the cathode.

Notwithstanding these attempts to limit the susceptibility to sustained parasitic thyristor latch-up, the presence of an adjacent parasitic thyristor between the anode and cathode poses a risk that under certain operating conditions, parasitic latch-up will occur.

SUMMARY OF THE INVENTION

It is therefore an object of the present invention to provide a semiconductor switching device with high input impedance, low on-state voltage drop and gate controlled turn-on and turn-off.

It is another object of the present invention to provide a semiconductor switching device capable of being turned off at high forward current densities and having reduced susceptibility to parasitic latch-up.

These and other objects are provided, according to the present invention by a semiconductor switching device comprising a thyristor having a floating emitter region, transistor means for electrically connecting the floating emitter region to the thyristor's cathode region, and means, between the cathode region and the thyristor's second base region, for insulating the cathode region from the second base region. By insulating the cathode region from the second base region, the formation of a parasitic thyristor between the thyristor's anode region and cathode region is precluded.

In particular, the semiconductor switching device according to the present invention comprises a thyristor in a semiconductor substrate. The thyristor comprises an anode region of second conductivity type, a first base region of first conductivity type on the anode region, a second base region of second conductivity type on the first base region and a floating emitter region of first conductivity type contacting the second base region and forming a P-N junction therewith. A cathode region is also provided, in the substrate, preferably adjacent the floating emitter region. The cathode region is electrically connected to a cathode contact, and is separated from the floating emitter region by transistor means. The transistor means is provided for electrically connecting the cathode region to the floating emitter region when a turn-on bias signal of appropriate polarity is applied thereto.

An insulating region is provided between the second base region and the cathode region. The insulating region prevents direct electrical conduction between the second base region and the cathode region and eliminates the contiguous P-N-P-N region that would otherwise exist between the anode region and cathode region and cause parasitic thyristor latch-up. The insulating region can comprise a buried dielectric layer in the substrate selected from the group consisting of $SiO_2$, $Si_3N_4$, $Al_2O_3$ and $MgAl_2O_4$, but may also comprise other similar dielectric materials compatible with semiconductor device processing. Thus, while many prior art thyristors include contiguous P-N-P-N regions between the anode and cathode contacts and are susceptible to parasitic latch-up, the presence of an insulating region between the cathode region and the second base region prevents the formation of a parasitic thyristor.

The transistor means preferably comprises a first conductivity type channel enhancement-mode field effect transistor on the insulating region, between the cathode region and the floating emitter region. Accordingly, in response to an appropriate polarity bias signal, a conductive channel is created between the cathode region and the floating emitter region. This electrical connection facilitates turn-on, and the removal of the electrical connection provides turn-off. Turn-on of the semiconductor switching device is further facilitated by the presence of turn-on gating means in the second base region, between the floating emitter region and the first base region. The turn-on gating means preferably comprises a first conductivity type channel enhancement-mode field effect transistor also. As will be understood by one skilled in the art, if the gates of the two field effect transistors are electrically connected, the semiconductor switching device will have three external connections and will be operable with single-polarity gate control for both turn-on and turn-off.

Accordingly, the semiconductor switching device according to the present invention comprises an emitter-switched thyristor, and means, between the thyristor's cathode region and the thyristor's second base region, for insulating the cathode region from the second base region and preventing direct electrical conduction therebetween. The insulating region prevents a contiguous P-N-P-N region from forming between the cathode region and the anode region and causing uncontrolled latch-up.

DESCRIPTION OF A PREFERRED EMBODIMENT

The present invention will now be described more fully hereinafter with reference to the accompanying drawings, in which a preferred embodiment of the invention is shown. This invention may, however, be embodied in different forms including a complementary structure and should not be construed as limited to the embodiment set forth herein. Rather, this embodiment is provided so that this disclosure will be thorough and complete, and will fully convey the scope of the invention to those skilled in the art. Like numbers refer to like elements throughout.

Figure 1:
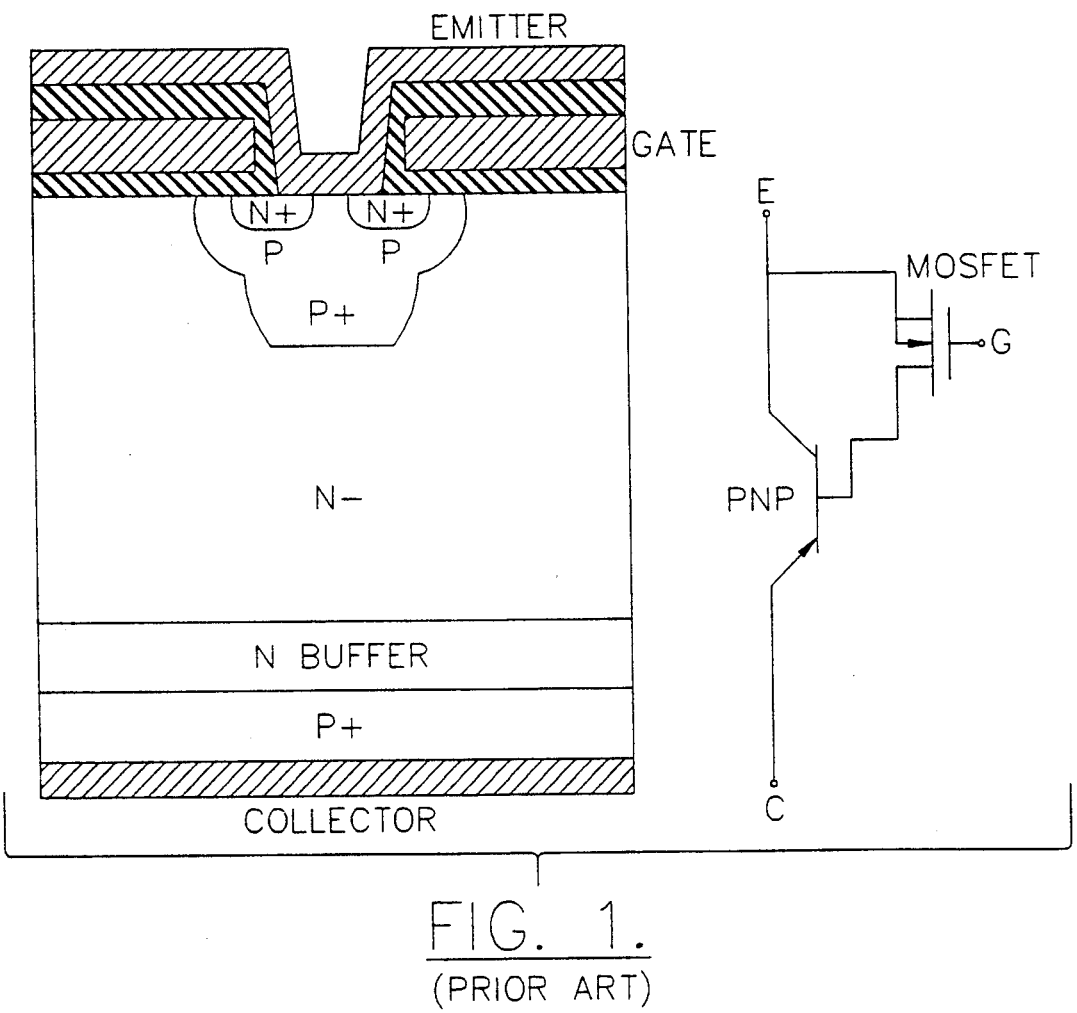
FIG. 1 illustrates a cross-sectional representation of a prior art insulated gate transistor (IGT).
Figure 2:
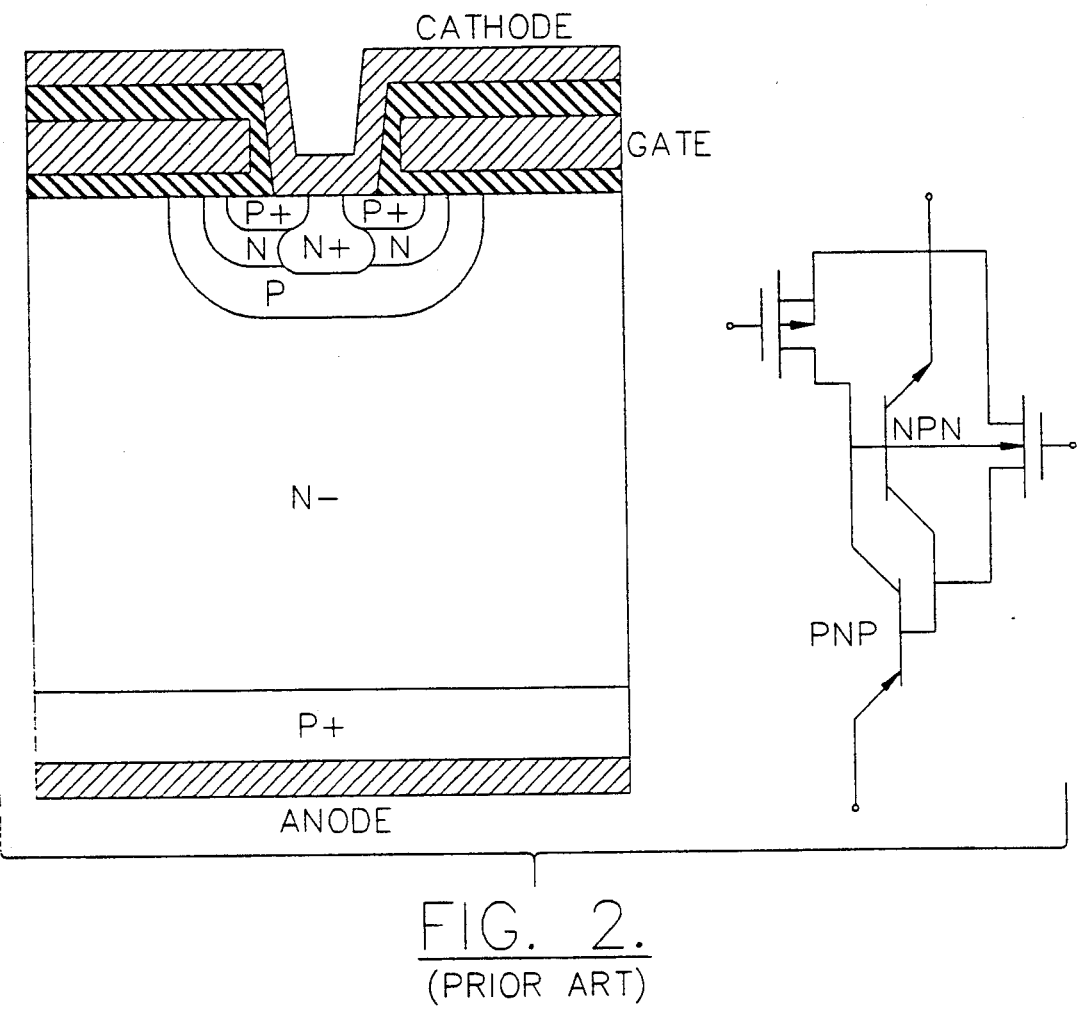
FIG. 2 illustrates a cross-sectional representation of a prior art MOS-Controlled Thyristor (MCT).
Figure 3:
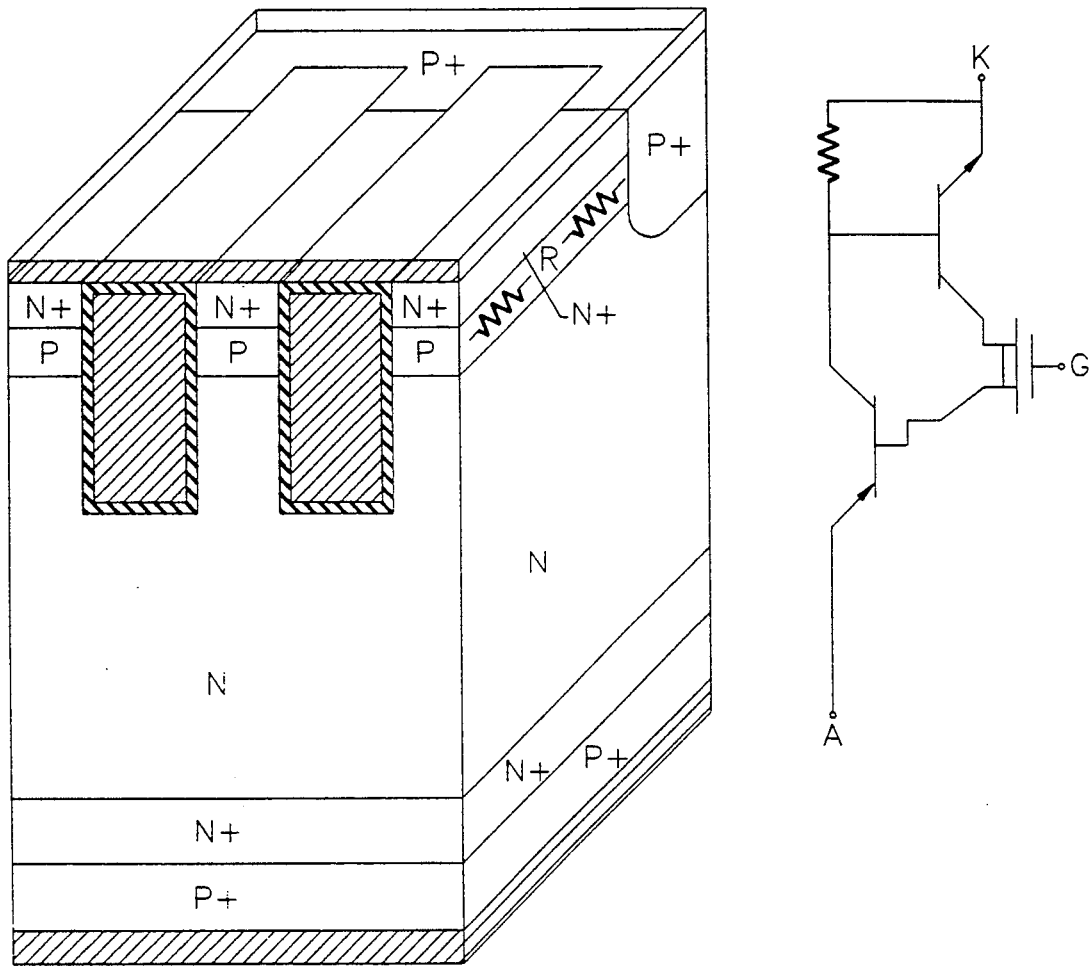
FIG. 3 illustrates a cross-sectional representation of a prior art Depletion Mode Thyristor (DMT).
Figure 4:
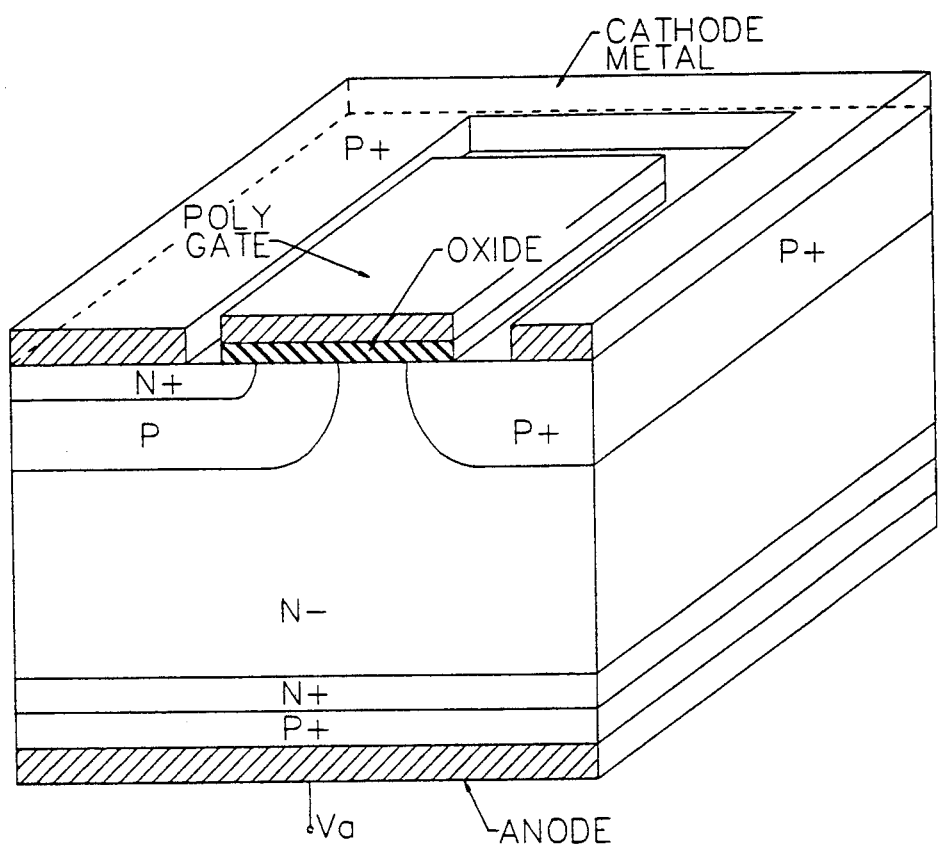
FIG. 4 illustrates a three-dimensional cross-sectional representation of a prior art Base Resistance Controlled Thyristor (BRT).
Figure 5A:
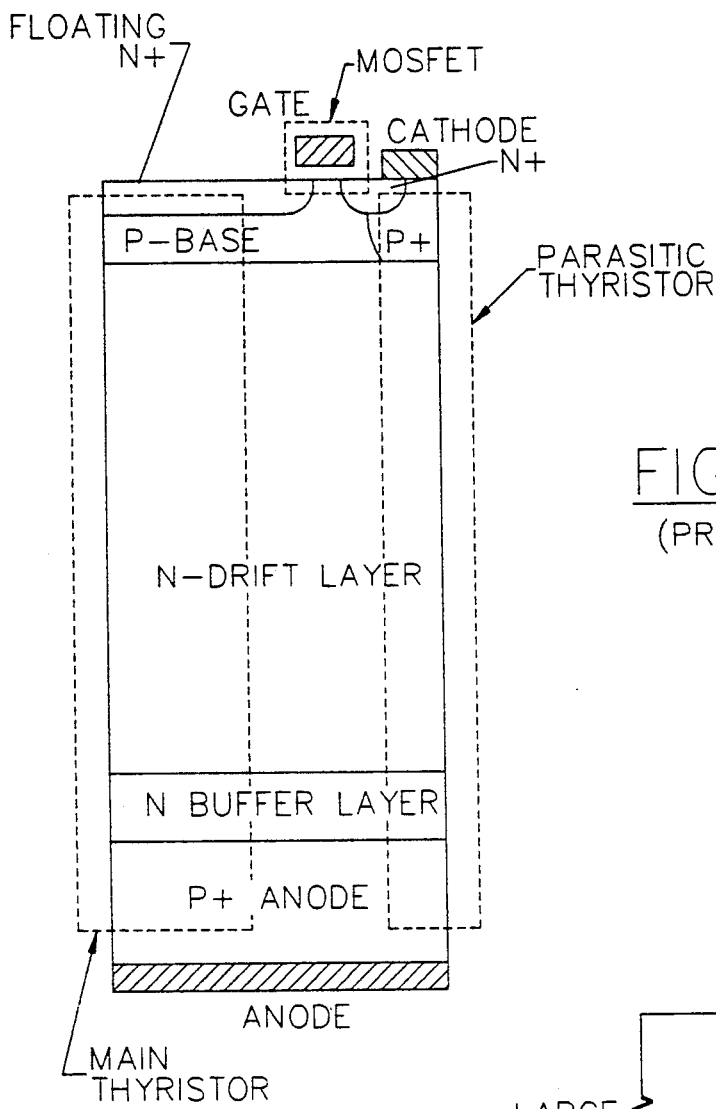
FIG. 5A illustrates a cross-sectional representation of a prior art Emitter Switched Thyristor (EST).
Figure 5B:
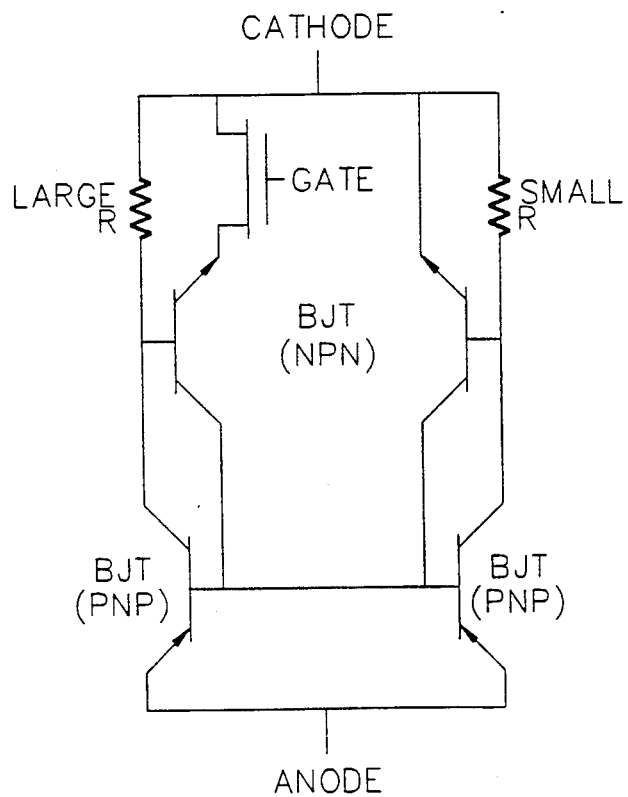
FIG. 5B illustrates an equivalent electrical circuit schematic for the EST shown in FIG. 5A.
Figure 6:
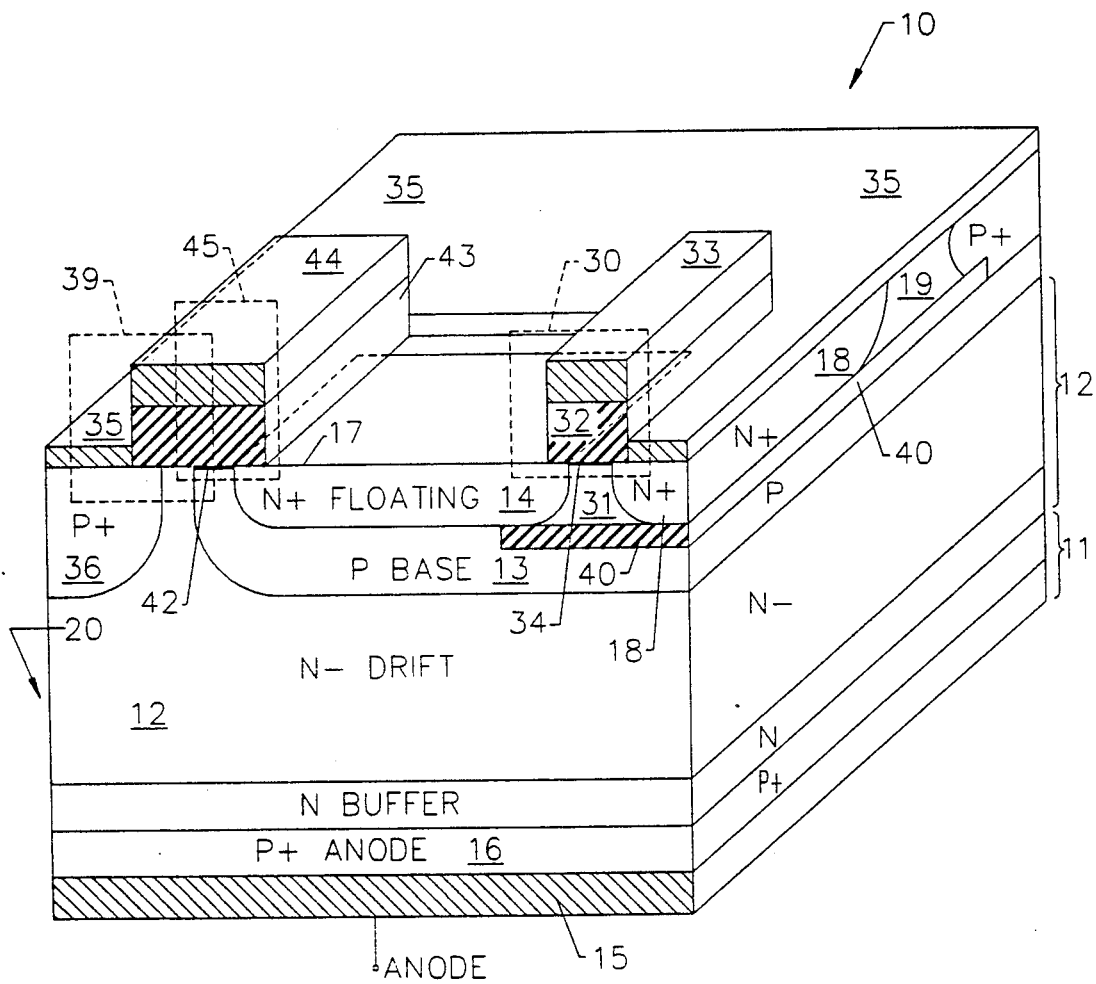
FIG. 6 illustrates a three-dimensional cross-sectional representation of the semiconductor switching device according to the present invention.

Referring now to FIG. 6, a three-dimensional representation of the semiconductor switching device 10 according to the present invention is shown. The switching device comprises a thyristor having contiguous P-N-P-N regions 11–14. Accordingly, the thyristor comprises an anode region 11, a first base region 12, a second base region 13 and a floating emitter region 14. The anode region 11 comprises an anode contact metallization layer 15 and a relatively highly doped region of second conductivity type 16. The first base region 12 extends to a face 17 of the semiconductor substrate 20. A second base region 13 of second conductivity type is also formed on the first base region 12. A floating emitter region 14 is also provided and contacts the second base region 13 to thereby form a P-N junction.

As will be understood by one skilled in the art, transistor means 30 comprises a first conductivity type channel enhancement-mode field effect transistor and performs the function of electrically connecting the cathode region 18 to the floating emitter region 14 in response to an appropriate polarity bias signal. It also performs the function of turning off the thyristor when the bias signal is removed. The active region of the field effect transistor comprises region 31 of second conductivity type. If the active region 31 is of P-type conductivity, a positive bias signal to gate electrode 33 will create an inversion layer channel 34 beneath gate oxide 32 and between the floating emitter region 14 (drain) and the cathode region 18 (source).

Still referring to FIG. 6, the switching device 10 also includes means for insulating the cathode region 18 from the second base region 13 and for preventing the formation of a parasitic thyristor between the anode region 11 and the cathode region 18. The insulating means preferably comprises an insulating region 40 between the cathode region 18 and the second base region 13. The insulating region is preferably a buried dielectric layer selected from the group consisting of $SiO_2$, $Si_3N_4$, $Al_2O_3$ and $MgAl_2O_4$, but may also comprise other dielectric materials compatible with semiconductor device processing. The dielectric layer may be formed by conventional implanted oxygen (SIMOX) technologies. Alternatively, the insulating region can be grown on the surface of a semiconductor substrate and epitaxial lateral overgrowth (ELO) process techniques can be used to form the floating emitter and the transistor means on the insulating region.

As will be understood by one skilled in the art, the presence of the insulating region 40 between the cathode region 18 and the second base region 13 precludes the formation of a regeneratively coupled parasitic thyristor region between the anode contact 15 and the cathode contact 35. Accordingly, parasitic thyristor latch-up is prevented and gate controlled turn-on and turn-off is provided by the transistor means 30. For additional electrical isolation between the cathode region 18 and the second base region 13, an extension of the insulating region 40, i.e., insulating region 19, may be incorporated in the substrate 20. Accordingly, the cathode contact 35, insulating region 40 and insulating region 19 prevent the cathode region 18 from electrically contacting the second base region 13.

To further facilitate turn-on, the floating emitter 14 is electrically connected to the first base region 12 in order to provide the base drive current required to initiate thyristor operation in regions 11-14. This electrical connection is provided by turn-on gating means 45, in the second base region. Preferably, the turn-on gating means 45 comprises a first conductivity type channel enhancement-mode field effect transistor such as a MOSFET, having gate 44 and gate oxide 43. The MOSFET electrically connects the first base region 12 to the floating emitter region 14, via the inversion channel 42, when an appropriate polarity turn-on bias signal is applied to gate 44. When the electrical connection provided by the turn-on gating means 45 is combined with the electrical connection provided the inversion layer channel 34, turn on of the thyristor will occur if the anode region 11 is biased positive with respect to the cathode region 18.

Although not necessary for turning off the thyristor, the rate of turn-off can be increased by providing a relatively highly doped region of second conductivity type 36 in the substrate 20, adjacent the second base region 13. This region, referred to as a diverter region by the art, provides a highly conductive path to the cathode contact 35. Accordingly, a second conductivity type channel enhancement-mode field effect transistor 39, having gate 44 and gate oxide 43, can be used to provide an electrical connection between the second base region 13 and the diverter region 36, to thereby shunt majority carriers in the second base region 13 to the cathode contact 35 during turn off. However, incorporating this additional feature for turning off the thyristor may require the application of a bias signal of opposite polarity from the bias signal used to turn-on the thyristor. Moreover, because the diverter region 36 is adjacent the second base region, the lateral dimensions of the semiconductor switching device may be increased, thereby reducing the degree of integration of unit cells, otherwise achievable in a semiconductor substrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor switching device comprising:
   a semiconductor substrate;
   a thyristor in said substrate, said thyristor having an anode region, a first base region of first conductivity type on said anode region, a second base region of second conductivity type on said first base region, and a floating emitter region of first conductivity type contacting said second base region and forming a P-N junction therewith;
   a cathode region of first conductivity type in said substrate, at a face thereof;
   transistor means in said substrate for electrically connecting said cathode region to said floating emitter region in response to a first turn-on bias signal; and
   means, including an electrical insulator in said substrate between said cathode region and said anode region, for preventing parasitic regenerative conduction between the P-N-P-N regions formed by said anode region, said first base region, said second base region and said cathode region, while allowing regenerative conduction between the P-N-P-N regions formed by said anode region, said first base region, said second base region and said floating emitter region.

2. The semiconductor switching device of claim 1, wherein said electrical insulator extends between said cathode region and said second base region.

3. The semiconductor switching device of claim 2, wherein said transistor means comprises a first conductivity type channel enhancement-mode field effect transistor having an active region between said cathode region and said floating emitter region, and on said electrical insulator.

4. The semiconductor switching device of claim 3, wherein said electrical insulator is selected from the group consisting of $SiO_2$, $Si_3N_4$, $Al_2O_3$ and $MgAl_2O_4$.

5. The semiconductor switching device of claim 3, further comprising turn-on gating means in said second base region for electrically connecting said floating emitter region to said first base region in response to a second turn-on bias signal.

6. The semiconductor switching device of claim 5, wherein said turn-on gating means comprises a first conductivity type channel enhancement-mode field effect transistor in said second base region, between said floating emitter region and said first base region.

7. An emitter-switched thyristor comprising:
   a semiconductor substrate;
   an anode region in said substrate;
   a first base region of first conductivity type on said anode region and extending to a face of said substrate;
   a second base region of second conductivity type on said first base region;
   an electrical insulating region on said second base region;

a floating emitter region of first conductivity type on said electrical insulating region, said floating emitter contacting said second base region and forming a P-N junction therewith;

a cathode contact at the face;

a cathode region of first conductivity type on said electrical insulating region, electrically connected to said cathode contact; and transistor means on said electrical insulating region for electrically connecting said cathode region and said floating emitter region in response to a first turn-on bias signal.

8. The emitter-switched thyristor of claim 7, wherein said electrical insulating region is selected from the group of $SiO_2$, $Si_3N_4$, $Al_2O_3$ and $MgAl_2O_4$.

9. The emitter-switched thyristor of claim 7, wherein said transistor means comprises a first conductivity type channel enhancement-mode MOSFET having a source in said cathode region and a drain in said floating emitter region.

10. The emitter-switched thyristor of claim 9, further comprising turn-on gating means in said second base region for electrically connecting said floating emitter region to said first base region in response to a second turn-on bias signal.

11. The emitter-switched thyristor of claim 10, wherein said turn-on gating means comprises a first conductivity type channel enhancement-mode field effect transistor between said floating emitter region and said first base region.

12. The emitter-switched thyristor of claim 11, further comprising a diverter region of second conductivity type in said first base region, outside and adjacent said second base region and electrically connected to said cathode contact; and a second conductivity type channel enhancement-mode field effect transistor in said substrate, between said second base region and said diverter region.

13. A semiconductor switching device comprising:
a semiconductor substrate;

a thyristor in said substrate, said thyristor having an anode region, a first base region of first conductivity type on said anode region, a second base region of second conductivity type on said first base region and extending to a face of said substrate, and a floating emitter region of first conductivity type in said substrate and contacting said second base region to thereby form a P-N junction;

a cathode contact at the face;

means in said substrate and including an electrical insulator between said cathode contact and said second base region, for preventing parasitic thyristor latch-up between said cathode contact and said anode region; and transistor means in said substrate for electrically connecting said cathode contact to said floating emitter region in response to a first turn-on bias signal.

14. The semiconductor switching device of claim 13, wherein said transistor means comprises a first conductivity type channel enhancement-mode field effect transistor having an active region on said electrical insulator, between said cathode contact and said floating emitter region.

15. The semiconductor switching device of claim 14, wherein said electrical insulator is selected from the group consisting of $SiO_2$, $Si_3N_4$, $Al_2O_3$ and $MgAl_2O_4$.

16. The semiconductor switching device of claim 14, further comprising turn-on gating means in said second base region for electrically connecting said floating emitter region to said first base region in response to a second turn-on bias signal.

17. The semiconductor switching device of claim 16, wherein said turn-on gating means comprises a first conductivity type channel enhancement-mode field effect transistor in said second base region, between said floating emitter region and said first base region.

* * * * *

UNITED STATES PATENT AND TRADEMARK OFFICE
CERTIFICATE OF CORRECTION

PATENT NO. : 5,306,930
DATED : April 26, 1994
INVENTOR(S) : Baliga

It is certified that error appears in the above-identified patent and that said Letters Patent is hereby corrected as shown below:

On title page, item [56]

UNDER "OTHER PUBLICATIONS":

Column 1, lines 1-2, "emitter" should be -- Emitter --.

Column 1, line 3, "Depletion Mode" should be -- Depletion-Mode --.

Column 1, line 3-4, "Vertical channel" should be -- Vertical-Channel --.

Column 1, line 5, after "645-647" add -- Electronics Letters, Vol. 15, No. 20 --.

Column 2, line 1, after "(MCT'S)" add ending quotation mark (").

Column 2, line 2, after "M-84" delete ending quotation mark (").

Column 2, line 4, "Translator" should be -- Transistor --.

Column 2, line 5, after "Device" add ending quotation mark (").

Column 2, line 6, after "Devices" delete ending quotation mark (").

Page 2, Column 2, line 1, after "Electron" add -- Device --.

UNITED STATES PATENT AND TRADEMARK OFFICE
CERTIFICATE OF CORRECTION

PATENT NO. : 5,306,930
DATED : April 26, 1994
INVENTOR(S) : Baliga

It is certified that error appears in the above-identified patent and that said Letters Patent is hereby corrected as shown below:

Column 7, line 49, "turn on" should be -- turn-on --.

Column 7, line 64, "turn off" should be -- turn-off --.

IN THE CLAIMS:

Column 9, line 15, after "group" insert -- consisting --.

Signed and Sealed this

Sixth Day of September, 1994

Attest:

BRUCE LEHMAN

Attesting Officer        Commissioner of Patents and Trademarks